United States Patent [19]
Rabii

[11] Patent Number: 5,281,926
[45] Date of Patent: Jan. 25, 1994

[54] PHASE LOCKED LOOP MADE OPERATIVE WHEN STABLE INPUT SYNC SIGNAL IS DETECTED

[75] Inventor: Khosro M. Rabii, Arlington Heights, Ill.

[73] Assignee: Zenith Electronics Corp., Glenview, Ill.

[21] Appl. No.: 957,201

[22] Filed: Oct. 6, 1992

[51] Int. Cl.$^5$ .................... H03L 7/085; H03L 7/18; H04N 5/04

[52] U.S. Cl. .................................. 331/14; 331/17; 331/20; 331/25; 358/158

[58] Field of Search .................. 331/14, 20, 25, 17; 358/158, 159

[56] References Cited

U.S. PATENT DOCUMENTS 5,019,907  5/1991  Murakoshi et al. .............. 358/158
5,038,116  8/1991  Motté .................................. 331/14

Primary Examiner—Siegfried H. Grimm

[57] ABSTRACT

An oscillator control system includes a phase-locked loop having a programmable frequency divider operative within the loop. A switch is further included within the phase-locked loop to permit the loop to be open or closed in response to an input signal. A counter accumulates oscillator clock signal counts between each successive rising edge portion of the applied sync signal. A pair of shift registers sequentially store successive clock signal counts for the current and previous sync signal intervals. The output counts are compared for consistency by producing a difference signal therebetween which is utilized to control the phase-locked loop switch and close it once the consistency of sync signal has been established. The output counts of the shift registers are combined and used to provide a scaling factor which sets the frequency division of the programmable frequency divider within the phase-locked loop and properly scales the oscillator frequency to the sync signal frequency.

18 Claims, 2 Drawing Sheets

PHASE LOCKED LOOP MADE OPERATIVE WHEN STABLE INPUT SYNC SIGNAL IS DETECTED

FIELD OF THE INVENTION

This invention relates generally to oscillator control systems and particularly to those used over an extended frequency range.

BACKGROUND OF THE INVENTION

Computer display monitors provide a convenient interactive capability which virtually all interactive computer systems rely upon. One of the most common types of computer display monitors is that utilizing a cathode ray tube display system. In such monitors, a cathode ray tube is provided which directs one or more intensity modulated electron beams at a phosphor display screen. In systems utilizing a raster scan, the electron beams are scanned at different frequencies in the horizontal and vertical display directions while the electron beams are intensity modulated by the video information to produce the desired video display. Because it is generally desirable to provide relatively flat display screens housed with compact monitor housings, the geometric relationships between the cathode ray tube electron source or sources and the display screen gives rise to a variety of geometric distortions of the scanned raster. In addition, other sources of distortion such as scanning system nonlinearity exacerbate these geometric distortions. In virtually all computer monitors, the scan process is adjusted or corrected to accommodate these problems in a process generally known as "geometric correction". Basically, this process involves utilizing the horizontal and vertical scan rate signals available within the scanning and synchronizing system to generate corrective signals. Since the use of such correction systems relies upon the appropriate relationship between horizontal and vertical scan signals, their synchronization and timing, and the corresponding predictable area of the raster scan display, accurate geometric correction requires reliable synchronizing signals.

The process of geometric correction is further complicated by the tendency of most computer display monitors to operate at a plurality of scan frequencies often extending over a substantial frequency range.

Thus, there arises a need in the art for reliable scan synchronizing systems to supply the necessary signals for accurate geometric correction of the display appropriate for use in the demanding environment of multifrequency display monitors.

Accordingly, it is a general object of the present invention to provide an improved geometric correction system. It is a more particular object of the present invention to provide a reliable source of accurately synchronized scan related signals for use in forming geometric correction signals suitable for use in multifrequency monitors.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENTS

Figure 1:
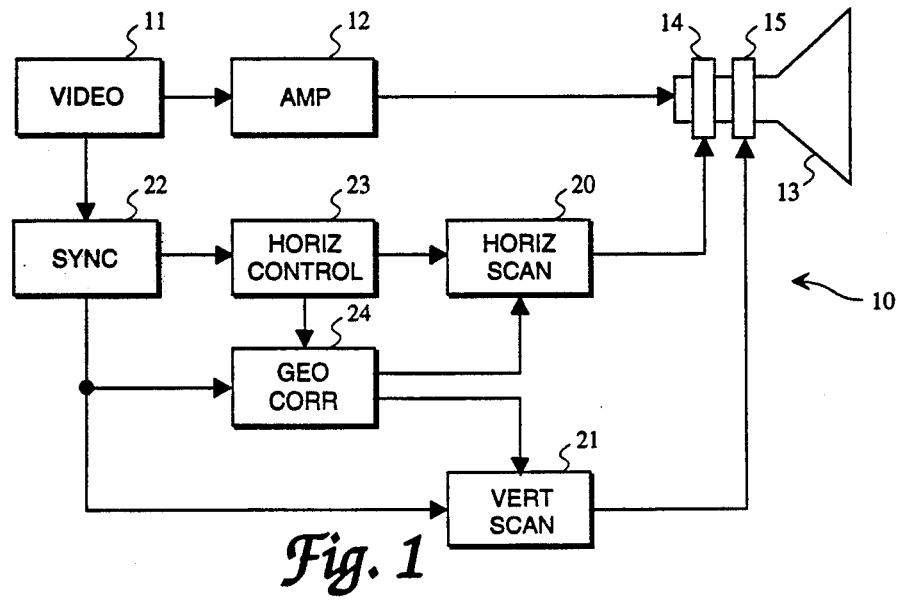
FIG. 1 sets forth a block diagram of a computer monitor having an oscillator control system constructed in accordance with the present invention.

FIG. 1 sets forth a block diagram of a typical computer monitor utilizing the present invention oscillator control system and generally referenced by numeral 10. Monitor 10 includes a cathode ray tube 13 having a horizontal yoke 14 and a vertical yoke 15 coupled thereto. A video source 11 is coupled to cathode ray tube 13 by an amplifier system 12. Video source 11 is further coupled to a sync signal circuit 22. A horizontal scan system 20 and a vertical scan system 21 are coupled to horizontal yoke 14 and vertical yoke 15 respectively. A horizontal control 23 is coupled to horizontal scan system 20 and sync circuit 22. Vertical scan system 21 is also coupled to sync circuit 22. A geometric correction circuit 24 is coupled to sync circuit 22 and horizontal control 23. The outputs of geometric control circuit 24 are coupled to horizontal scan system 20 and vertical scan system 21.

In operation, video source 11 produces a plurality of color video signals which are processed by amplifier system 12 in accordance with conventional fabrication techniques and utilized to intensity modulate the electron beams within cathode ray tube 13. Concurrently, horizontal scan system 20 and vertical scan system 21 produce respective horizontal and vertical scan signals which energize yokes 14 and 15 to provide horizontal and vertical scan of cathode ray tube 13. Sync circuit 22 processes the output of video source 11 to provide horizontal and vertical rate scan synchronizing signals which are utilized by horizontal control and vertical scan 21 to properly synchronize the scanning process of cathode ray tube 13 to the video signals used to intensity modulate the cathode ray tube beams. In accordance with the present invention, horizontal control 23 is further coupled to geometry correction circuit 24 which produces appropriate scan adjusting and correcting signals utilized by horizontal scan 20 and vertical scan 21 to provide geometry correction of cathode ray tube scanning.

In accordance with an important aspect of the present invention set forth below in greater detail, monitor 10 is anticipated to be utilized in response to a wide variety of scan signal frequencies. Accordingly, by means set forth below, horizontal control 23 determines the consistency and reliability of the applied horizontal sync signals and enables the control system therein only after stable consistent sync has been established. This permits horizontal control 23 to operate in an optimum condition to maintain optimum control of horizontal scan 20 while concurrently satisfying the wide range of scan frequencies utilized by monitor 10. In further accordance with the present invention, horizontal control 23 produces an output signal which is utilized by geometry correcting circuit 24 and which is properly synchronized to the horizontal sync signal.

Figure 2:
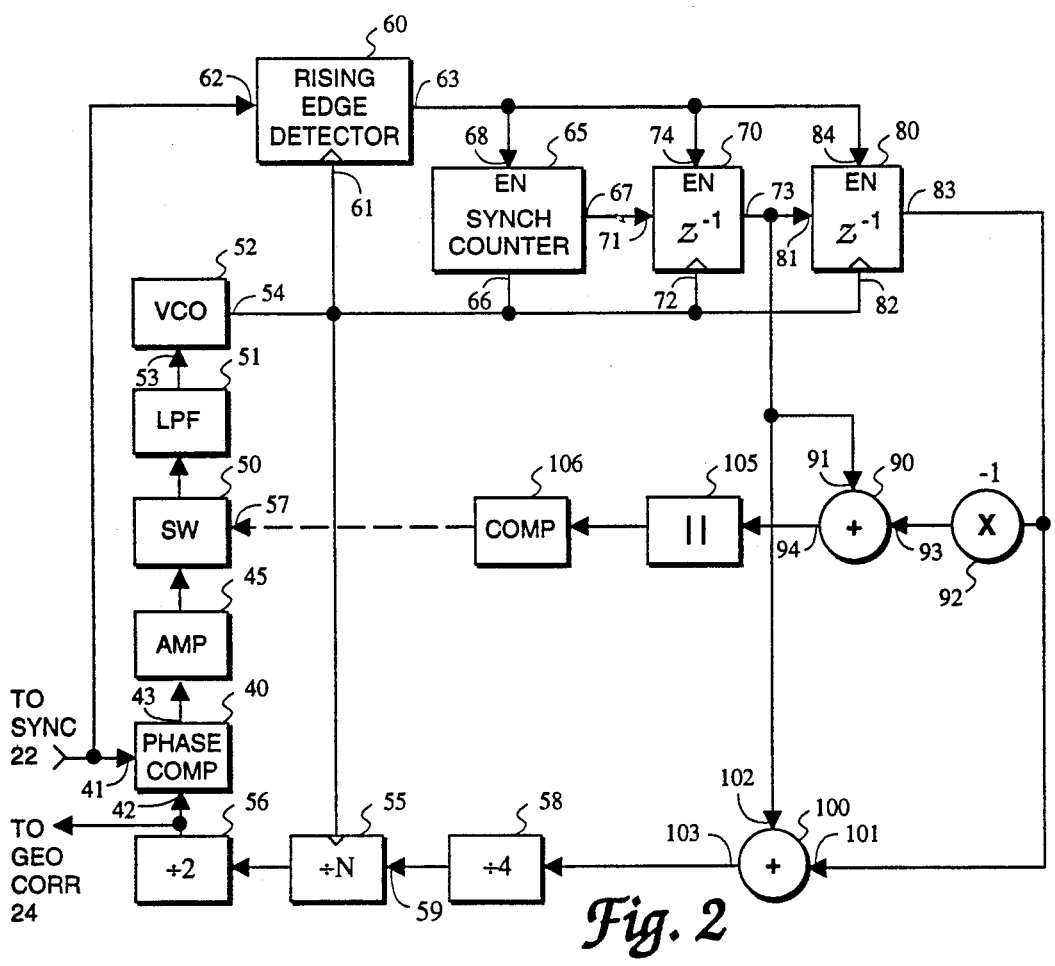
FIG. 2 sets forth a block diagram of the present invention oscillator control system.

FIG. 2 sets forth a block diagram of horizontal control 23. A phase comparator 40 includes a reference input 41 coupled to sync circuit 22 (seen in FIG. 1), an input 42, and an output 43. An amplifier 45 is coupled to a low pass filter 51 by a switching circuit 50. A voltage controlled oscillator 52 includes a frequency control input 53 coupled to the output of low pass filter 51 and an oscillator output 54. Output 54 is coupled to a programmable frequency divider 55 the output of which is coupled to a frequency divider 56. The output of frequency divider 56 is coupled to input 42 of phase comparator 40 and to geometry correction circuit 24 (s ® ®n in FIG. 1). A rising edge detector 60 includes a clock signal input 61 coupled to the output of oscillator 52, an input 62 coupled to sync signal input 41 of comparator 40 and an output 63. A synchronous counter 65 includes a clock signal input 66 coupled to output 54 of oscillator 52, a clear input 68 coupled to output 63 of edge detector 60 and an output 67.

A pair of shift registers 70 and 80 include enabling signal inputs 74 and 84 respectively coupled to output 63 of edge detector 60 and clock signal inputs 72 and 82 respectively coupled to output 54 of oscillator 52. Register 70 further includes an input 71 coupled to output 67 of counter 65 and an output 73 coupled to input 81 of register 80. Register 80 further includes an output 83.

An adder 90 includes an input 91 coupled to output 73 of register 70 and an input 93 coupled to output 83 of register 80 through a negative one multiplier circuit 92. Adder 90 further includes an output 94 coupled to an absolute value circuit 105, the output of which is coupled to a comparator 106. Comparator 106 is coupled to control input 57 of switch 50. An adder 100 includes a pair of inputs 101 and 102 coupled to outputs 83 and 73 respectively of registers 80 and 70. Adder 100 further includes an output 103 coupled to a frequency divider 58, the output of which is coupled to input 59 of programmable divider 55.

In operation, the horizontal control circuit of FIG. 2 is activated initially as a synchronizing signal from sync circuit 22 is coupled to rising edge detection circuit 60 and phase comparator 40. Oscillator 52 comprises a free-running oscillator and thus produces a continuous output signal at output 54 which is applied to clock rising edge detection circuit 60. Upon the concurrence of a clock signal from oscillator 52 and the rising edge of the applied synchronizing signal from sync circuit 22 (seen in FIG. 1), edge detection circuit 60 produces an output signal which is simultaneously coupled to the clear input of counter 65 and the enabling inputs of registers 70 and 80. Counter 65 is clocked by the output signal of oscillator 52 and, as a result, accumulates an output count at output 67 each timing rising edge detection circuit 60 producing an edge signal at clear input 68. Thus, following each detected rising edge of the applied synchronizing signal, the output count at output 67 of counter 65 is cleared and counter 65 restarts its count of output clock signals from oscillator 52. In addition to clearing the output count of counter 65, the edge detection signal of detector 60 operates to shift the output count from counter 65 to register 70 and shift the stored count within register 70 to register 80.

Thus, as successive rising edges of successive horizontal synchronizing signals produce output signals at edge detector 60, the successive numeric counts between synchronizing signal rising edges are shifted sequentially from counter 65 to register 70 and thereafter to register 80. As a result, register 70 retains the most recent output count of counter 65 while register 80 stores the previous output count of counter 65.

The combination of adder 90 and negative one multiplier 92 produces a subtraction between the stored clock signal counts of registers 70 and 80. The absolute value of the difference between the stored counts of registers 70 and 80 is taken by absolute value circuit 105 and applied to a threshold comparator 106. Threshold comparator 106 compares the absolute value of the applied difference count to a predetermined reference number and closes switch 50 each time the absolute value of the count difference is less than the predetermined magnitude.

It should be understood that in response to a stable sync signal input, the time interval between successive rising edge signals detected by detector 60 and used to clear and reset counter 65 will remain relatively constant. As a result, the output count of counter 65 accumulated each time the rising edge signal clears counter 65 and shifts the output count successively through registers 70 and 80 will also tend to remain relatively constant. As a consequence, the stored counts of registers 70 and 80 will also be nearly identical. As a result, the subtracted difference between the stored counts of registers 70 and 80 will be smaller than the reference magnitude used by threshold comparator 106 causing switch 57 to be closed.

Conversely, in the event the applied synchronizing signal is unstable or varying erratically, the intervals between successive rising edge signals produced by detector 60 will correspondingly vary which in turn produces substantial variation of output counts accumulated by counter 65 between rising edge signals. These varying output counts will be sequentially shifted through registers 70 and 80 and will cause registers 70 and 80 to store substantially different output counts. When these output counts are subtracted by adder 90 and multiplier 92, a greater magnitude difference signal will be produced which will have an absolute value greater than the threshold magnitude or reference magnitude of comparator 106. With an input difference signal greater than the predetermined reference magnitude applied to its comparison input, comparator 106 opens switch 57 and maintains switch 57 in an open condition until the applied difference signal is less than the established reference magnitude.

With switch 57 in an open condition, oscillator 52 is essentially free-running in that no control signal is applied to control input 53. Once switch 50 closes, however, in response to the establishment of a consistent sync signal input, the combination of oscillator 52, frequency dividers 55 and 56, phase comparator 40, amplifier 45 and low pass filter 51 form a phaselocked loop in which the phase of the frequency divided output signal of oscillator 52 is compared by phase comparator 40 to the applied sync signal to produce an error voltage which is amplified by amplifier 40 and applied to control input 53 of oscillator 52 through low pass filter 51. Conversely, in the event the absolute value difference signal applied to threshold comparator 106 by absolute value circuit 105 indicates unstable or inconsistent sync signals, switch 57 is opened and the phase-locked loop operative upon oscillator 52 is interrupted leaving oscillator 52 to run at its natural frequency.

In accordance with an important aspect of the present invention, the frequency division applied by programmable divider 55 to the output signal of oscillator 55 prior to its application to phase comparator 40 and frequency divider 56 is scaled in accordance with the current and previous numeric counts of counter 65 stored within registers 70 and 80 Thus, the stored counts of register 70 and 80 are added by adder 100 to produce an output number which is divided by four by divider 58 and applied to scaling input 59 of programmable divider 55. Divider 55 applies a frequency division to the output signal of oscillator 52 which corresponds to the numeric count input at input 59. This frequency divided output signal of programmable divider 55 is further divided by a divide by two frequency divider 56 and applied to phase comparator 40. It should be recalled that the phase-locked loop operative upon oscillator 52 remains open in the absence of stable and consistent sync signal inputs. Thus, switch 57 is closed closing the phase-locked loop operative upon oscillator 52 only after at least two successive sync signal intervals have occurred. This assures that the scaling factor applied to programmable divider 55 results from stable consistent sync input and in turn assures that the scaling factor of programmable divider 55 is correct.

For example, assuming oscillator 52 has a frequency of one megahertz and assuming an input sync signal having a frequency of ten kilohertz applied, synchronous counter 65 will produce output numeric counts of one hundred in response to each sync signal rising edge. If the applied sync signal is a consistent ten kilohertz signal, the output counts stored successively in registers 70 and 80 will also be equal to or close to one hundred. The resulting difference signal as adder 90 subtracts the output of register 80 from the output of register 70 will be correspondingly small or equal to zero which in turn will cause threshold comparator 106 to close switch 57. Concurrently, the applied numeric counts at adder 100 will each be equal to or close to one hundred producing an output count equal to or close to 200. For purposes of illustration, an output of adder 100 equal to 200 will be assumed. It will be recognized by those skilled in the art that a small variation above or below 200 may in fact result. Assuming the output count of 200 is applied to divider 58, a numeric input equal to fifty will be applied to scaling input 59 of programmable divider 55. Divider 55 will impose a frequency division equal to the scaling input upon the one megahertz output signal of oscillator 52. Thus, the signal applied to frequency divider 56 will be equal to one megahertz divided by fifty or twenty kilohertz. Divider 56 will further divide the twenty kilohertz input signal to ten kilohertz which will correspond to the applied sync signal frequency and produce the desirable phase comparison results.

Similarly, in the event a twenty kilohertz sync signal is applied, the numeric count produced by synchronous counter 65 between rising edge signals will be approximately fifty as will the stored counts of registers 70 and 80. Once again, so long as the sync signal input is consistent, the subtracted difference signal of adder 90 will remain small and switch 57 will be closed. With the output counts of registers 70 and 80 equal to fifty, the numeric output of adder 100 will be equal to one hundred. The one-fourth division of divider 58 will reduce the applied numeric count from one hundred to twenty five which will then comprise the scaling factor input to programmable divider 55. Programmable divider 55 will then impose a frequency division of twenty five upon the applied one megahertz oscillator signal producing a forty kilohertz output signal which is further divided by frequency divider 56 to twenty kilohertz and which again corresponds to the applied sync signal frequency.

Thus, the system shown is operative to maintain an open loop condition upon the voltage controlled oscillator until consistent sync signal is detected. This consistency is determined by utilizing successive numeric counts of the oscillator output signal between rising edge portions of the applied sync. Successive numeric counts are stored in a pair of shift registers and subtracted to provided a difference count which is a measure of sync signal consistency. Once the difference count is sufficiently small to indicate consistent sync signal intervals, the output counts of the two previous sync signal intervals are utilized to provide a scaling factor for a programmable frequency divider operative within the feedback loop of the phase-locked loop. As a result, the oscillator within the phase-locked loop is maintained within a narrow frequency range while a programmable frequency divider is utilized to properly scale the oscillator signal to the applied sync signal frequency. This provides an extremely stable phase-locked loop operation while accommodating an extremely broad range of sync signal frequencies. The use of a sync consistency detector to enable the phase-locked loop avoids phase-locked loop responses or attempted responses to erratic or inconsistent sync. Thus, transition difficulties and sync signal interruptions have little or no effect upon the frequency of the oscillator.

Figure 3:
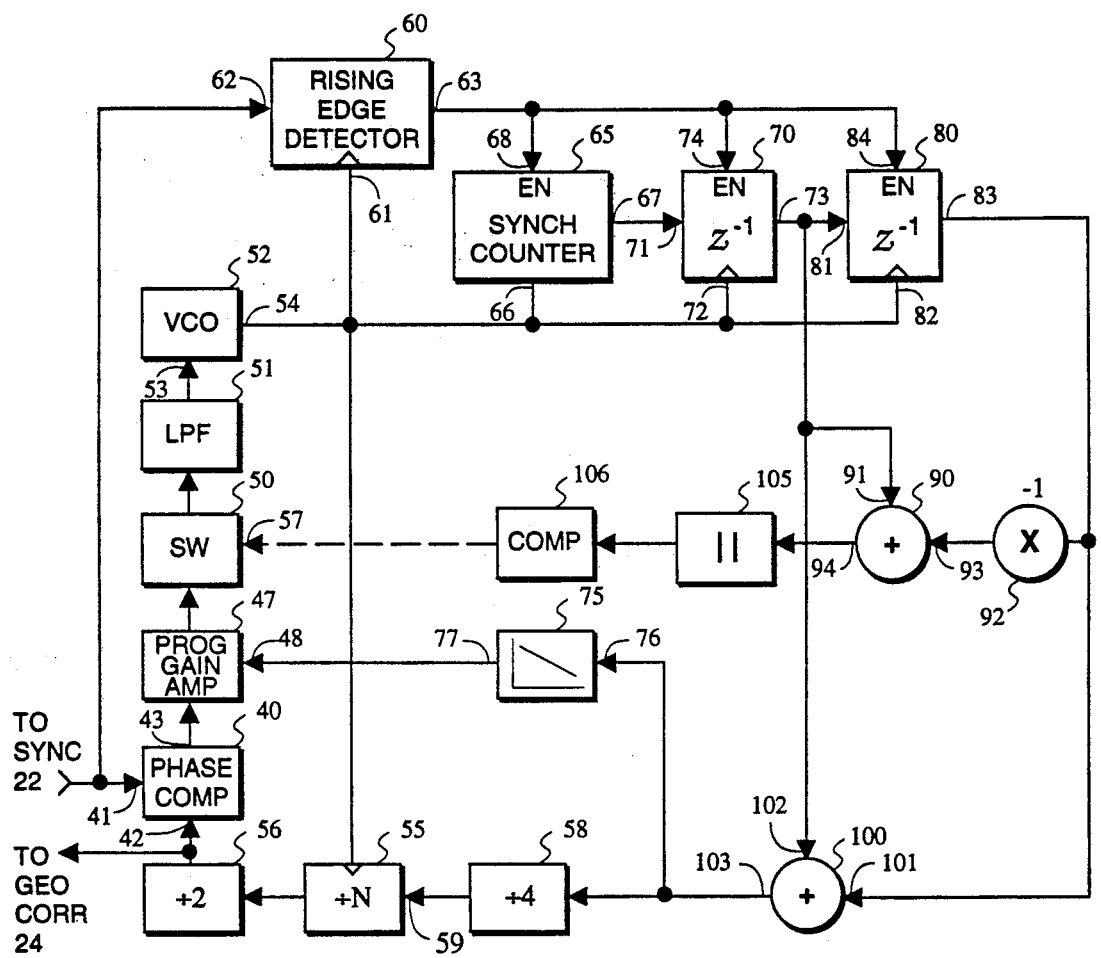
FIG. 3 sets forth an alternate embodiment of the present invention oscillator control system.

FIG. 3 sets forth an alternate embodiment of the present invention which is substantially identical to the embodiment shown in FIG. 2 with the addition of a programmable loop gain capability for the phase-locked loop. Thus, the circuit of FIG. 3 replaces amplifier 45 with a programmable gain amplifier 47. Amplifier 47 is coupled between the output of phase comparator 40 and switch 50 and includes a gain control input 48. The circuit of FIG. 3 further includes an inverse gain characteristic circuit 75 which includes an input 76 coupled to output 103 of adder 100 and an output 77 coupled to input 48 of programmable gain amplifier 47.

In operation, the system of FIG. 3 with the exception of programmable gain amplifier 47 and inverse gain circuit 75 is operative in the manner described above to control oscillator 52 solely in response to consistent stable sync signals. In addition, the operation of programmable divider 55 in response to the input scaling factor applied to input 59 is also identical to that set forth above. The operational difference between the circuit of FIG. 3 from that of FIG. 2 is found in the use of the output numeric count of adder 100 to provide a gain control signal to amplifier 47 which is inversely related to the frequency of synchronizing signal applied. Thus, in the above-described examples in which a ten kilohertz sync signal is applied, it should be recalled that the output numeric count of adder 100 was approximately equal to two hundred. This numeric count of approximately two hundred when applied to inverse gain circuit 75 produces a gain control voltage which adjusts the gain of programmable amplifier 47 at the appropriate gain level. If, however, as is also set forth above, the frequency of applied sync signal is equal to twenty kilohertz, a numeric count of approximately one hundred exists at output 103 of adder 100. This numeric count of one hundred when applied to inverse gain circuit 75 produces an output control voltage applied to amplifier 47 which reduces the gain of amplifier 47. In its simplest form, for example, inverse gain circuit 75 may comprise a simple converter which produces an output control voltage corresponding to the applied numeric count at input 76. Correspondingly, in such case, programmable amplifier 47 is configured to respond directly to the magnitude of applied gain control signal. Thus, as frequency of applied sync signal is increased, the numeric count at input 76 is correspondingly decreased due to the shorter interval between rising edge signals at detector 60 which in turn produces a smaller numeric count signal at output 77 and reduces the gain of amplifier 47.

The inverse gain characteristic of amplifier 47 is desirable to optimize the characteristics of the phase-locked loop operative upon oscillator 52 in accordance with well known phase-locked loop behavior.

What has been shown is an improved oscillator control system which utilizes a novel means for detecting the stability and consistency of the horizontal sync signal and utilizes this sync condition to selectively open or close the phase-locked loop operative upon the oscillator. The phase-locked loop includes a programmable frequency divider which receives a scaling factor derived from the operation of the sync stability and consistency determining portion of the system. The use of the programmable frequency divider and scaling factor permits the operation of the system oscillator within a narrow range while achieving accommodation of a broad range of sync signal frequencies.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. A method for controlling an oscillator signal in response to a sync signal comprising the steps of:
   establishing a succession of numeric counts representative of successive sync signal intervals;
   determining the consistency of successive numeric counts as a measure of sync signal consistency; and
   operating a phase lock loop upon said oscillator when sync signal consistency is established.

2. The method of claim 1 further including the step of frequency dividing the output signal of said oscillator by a factor directly related to said numeric counts.

3. The method of claim 2 wherein said determining step includes the steps of:
   subtracting a selected numeric count from a numeric count preceding it to obtain a difference number;
   taking the absolute value of said difference number;
   comparing said absolute value to a reference number; and
   opening said phase-locked loop unless said absolute value is equal to or less than said reference number.

4. The method of claim 3 wherein said step of frequency dividing includes the steps of:
   adding said selected numeric count to said preceding numeric count to form a numeric sum;
   dividing said numeric sum by a fixed number to produce a scaling factor; and
   frequency dividing said oscillator signal during said step of operating said phase-locked loop by said scaling factor.

5. The method of claim 4 wherein said selected numeric count is the most recent count and said numeric count preceding it is the directly preceding count.

6. The method set forth in claim 1 wherein said step of operating a phase-locked loop includes the steps of:
   frequency dividing said oscillator signal by a scaling factor to produce a frequency divided oscillator signal;
   phase comparing said frequency divided oscillator signal to said sync signal to produce an error signal;
   coupling said error signal to said oscillator to control the frequency thereof only after sync signal consistency has been established.

7. The method of claim 6 wherein said determining step includes the steps of:
   subtracting a selected numeric count from a numeric count preceding it to obtain a difference number;
   taking the absolute value of said difference number;
   comparing said absolute value to a reference number; and
   opening said phase-locked loop unless said absolute value is equal to or less than said reference number.

8. The method of claim 7 wherein said step of frequency dividing includes the steps of:
   adding said selected numeric count to said preceding numeric count to form a numeric sum;
   dividing said numeric sum by a fixed number to produce a scaling factor; and
   frequency dividing said oscillator signal during said step of operating said phase-locked loop by said scaling factor.

9. The method of claim 8 wherein said selected numeric count is the most recent count and said numeric count preceding it is the directly preceding count.

10. For use in controlling an oscillator signal in response to a sync signal control means comprising:
    means for establishing a succession of numeric counts representative of successive sync signal intervals;
    means for determining the consistency of successive numeric counts as a measure of sync signal consistency; and
    means for operating a phase lock loop upon said oscillator when sync signal consistency is established.

11. Control means as set forth in claim 10 further including means for frequency dividing the output signal of said oscillator by a factor directly related to said numeric counts.

12. Control means as set forth in claim 11 wherein said means for determining includes:
    means for subtracting a selected numeric count from a numeric count preceding it to obtain a difference number;
    means for taking the absolute value of said difference number;
    means for comparing said absolute value to a reference number; and
    means for opening said phase-locked loop unless said absolute value is equal to or less than said reference number.

13. Control means a set forth in claim 12 wherein said means for frequency dividing includes:
    means for adding said selected numeric count to said preceding numeric count to form a numeric sum;
    means for dividing said numeric sum by a fixed number to produce a scaling factor; and
    means for frequency dividing said oscillator signal during said step of operating said phase-locked loop by said scaling factor.

14. Control means as set forth in claim 13 wherein said selected numeric count is the most recent count and said numeric count preceding it is the directly preceding count.

15. The method set forth in claim 10 wherein said means for operating a phase-locked loop includes:
  means for frequency dividing said oscillator signal by a scaling factor to produce a frequency divided oscillator signal;
  means for phase comparing said frequency divided oscillator signal to said sync signal to produce an error signal;
  means for coupling said error signal to said oscillator to control the frequency thereof only after sync signal consistency has been established.

16. Control means as set forth in claim 15 wherein said means for determining includes:
  means for subtracting a selected numeric count from a numeric count preceding it to obtain a difference number;
  means for taking the absolute value of said difference number;
  means for comparing said absolute value to a reference number; and
  means for opening said phase-locked loop unless said absolute value is equal to or less than said reference number.

17. Control means as set forth in claim 16 wherein said means for frequency dividing includes:
  means for adding said selected numeric count to said preceding numeric count to form a numeric sum;
  means for dividing said numeric sum by a fixed number to produce a scaling factor; and
  means for frequency dividing said oscillator signal during said step of operating said phase-locked loop by said scaling factor.

18. Control means as set forth in claim 17 wherein said selected numeric count is the most recent count and said numeric count preceding it is the directly preceding count.

* * * * *